(12) United States Patent
Tagashira (10) Patent No.: US 11,458,643 B2
(45) Date of Patent: Oct. 4, 2022

(54) ROBOT CONTROLLER (71) Applicant: KAWASAKI JUKOGYO KABUSHIKI KAISHA, Kobe (JP)

(72) Inventor: Tsuyoshi Tagashira, Kakogawa (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 535 days.

(21) Appl. No.: 16/489,218

(22) PCT Filed: Feb. 26, 2018

(86) PCT No.: PCT/JP2018/007049
§ 371 (c)(1),
(2) Date: Aug. 27, 2019

(87) PCT Pub. No.: WO2018/155693
PCT Pub. Date: Aug. 30, 2018

(65) Prior Publication Data
US 2020/0016775 A1    Jan. 16, 2020

(30) Foreign Application Priority Data
Feb. 27, 2017 (JP) .............................. JP2017-035039

(51) Int. Cl.
B25J 19/00 (2006.01)
B25J 9/00 (2006.01)

(52) U.S. Cl.
CPC .......... B25J 19/0054 (2013.01); B25J 9/0009 (2013.01)

(58) Field of Classification Search
CPC ............................ B25J 19/0054; B25J 9/0009
See application file for complete search history.

(56) References Cited

U.S. PATENT DOCUMENTS

| 5,297,004 A | 3/1994 | Mazura |
| 6,266,243 B1 | 7/2001 | Tomioka |
| 2002/0089825 A1 | 7/2002 | Sasaki et al. |
| 2009/0034309 A1* | 2/2009 | Ibori ................. H05K 7/20909 363/141 |
| 2010/0262285 A1* | 10/2010 | Teranaka ............. H05K 7/1464 700/245 |
| 2012/0241135 A1 | 9/2012 | Takigawa et al. |
| 2017/0030602 A1* | 2/2017 | Tseng ....................... F24F 11/30 |
| 2017/0055359 A1* | 2/2017 | Teranaka ................. B25J 9/161 |

(Continued)

FOREIGN PATENT DOCUMENTS

| CN | 102196714 A | 9/2011 |
| JP | S60-2892 U | 1/1985 |
| JP | H02-52393 U | 4/1990 |

(Continued)

OTHER PUBLICATIONS

Jan. 11, 2022 Japanese Office Action issued in Japanese Patent Application No. 2021-034249.

*Primary Examiner* — Dale Moyer
(74) *Attorney, Agent, or Firm* — Oliff PLC (57) ABSTRACT A robot controller is a controller configured to control a motor of a robot and includes: a housing accommodating a heat generating part that generates heat; a vent hole that is open on a wall of the housing; a fan configured to supply air, introduced through the vent hole into the housing, to the heat generating part; and a lid part configured to cover the vent hole.

6 Claims, 6 Drawing Sheets (56) References Cited

U.S. PATENT DOCUMENTS

2019/0115808 A1* 4/2019 Soda ................. B25J 9/0009
2020/0039095 A1* 2/2020 Wagner ............. H05K 7/20145

FOREIGN PATENT DOCUMENTS

| | | |
|---|---|---|
| JP | H03-98740 A | 4/1991 |
| JP | H04-7898 A | 1/1992 |
| JP | H05-237775 A | 9/1993 |
| JP | 2002134968 A | 5/2002 |
| JP | 2002-280779 A | 9/2002 |
| JP | 2005-150667 A | 6/2005 |
| JP | 2006-055937 A | 3/2006 |
| JP | 2006-100347 A | 4/2006 |
| JP | 2007-175856 A | 7/2007 |
| JP | 2012-199412 A | 10/2012 |
| JP | 2012-218136 A | 11/2012 |
| JP | 2014-030866 A | 2/2014 |
| JP | 2015-109386 A | 6/2015 |
| JP | 2015-136780 A | 7/2015 |
| JP | 2016-217635 A | 12/2016 |
| KR | 20-0464824 Y1 | 1/2013 |
| KR | 1020130098881 A | 9/2013 |
| TW | 461236 B | 10/2001 |
| WO | 2011140179 A2 | 11/2011 |

* cited by examiner

ROBOT CONTROLLER

TECHNICAL FIELD

The present invention relates to a robot controller, and for example, relates to a robot controller configured to control a robot.

BACKGROUND ART

A controller described in PTL 1 is known as a controller configured to control a robot. This controller includes: a power circuit substrate configured to supply electric power to a motor of an industrial robot; a casing main body accommodating the power circuit substrate and made of metal; and a fan provided on a surface wall of the casing main body.

CITATION LIST

Patent Literature

PTL 1: Japanese Laid-Open Patent Application Publication No. 2015-136780

SUMMARY OF INVENTION

Technical Problem

The controller, such as the controller of PTL 1, configured to control the robot has peculiarities as compared to general home electric appliances, i.e., for example, the controller configured to control the robot is used under an environment where dust, cutting fluid mist, and/or the like float. However, according to the controller described in PTL 1, the fan provided on the surface wall of the casing main body introduces outside air into the casing main body. Therefore, although it depends on a use environment, outside air containing dust and liquid may flow into the casing main body, and electronic parts in the casing main body may be adversely influenced by the dust and the liquid.

To deal with this, there is a method of accommodating the entire casing main body in a sealed container to seal the casing main body from the outside air by the sealed container. However, in this case, the controller increases in size.

The present invention was made to solve the above problems, and an object of the present invention is to provide a robot controller capable of reducing adverse influence caused by dust and the like while suppressing an increase in size.

Solution to Problem

A robot controller according to one aspect of the present invention is a robot controller configured to control a motor of a robot, the robot controller including: a housing accommodating a heat generating part that generates heat; a vent hole that is open on a wall of the housing; a fan configured to supply air, introduced through the vent hole into the housing, to the heat generating part; and a lid part configured to cover the vent hole.

According to this configuration, by detaching the lid part, the robot controller can be used with the housing open, and by attaching the lid part, the robot controller can be used with the housing sealed. In this sealed state, adverse influence on electronic parts in the housing by dust and the like introduced into the housing through the vent hole can be reduced. Further, other portions at which the sealing property is secured do not have to be covered, and therefore, an increase in size of the robot controller can be suppressed.

In the robot controller, the wall may be a first wall, the fan may be a first fan, and a second wall of the housing may be made of a material having high heat conductivity, the heat generating part being fixed to the second wall. The robot controller may further include: a cover covering the second wall and including an opening portion; and a second fan arranged so as to be opposed to the opening portion and configured to supply the air to an inside of the cover through the opening portion. According to this configuration, the second wall is cooled by the air supplied by the second fan, and the heat generating part fixed to the second wall is cooled. Thus, the adverse influence on other parts by the heat of the heat generating part can be reduced.

The robot controller may further include a heat sink detachably attached to an outer surface of the second wall. The cover may cover the heat sink, and the second fan may supply the air to the heat sink. According to this configuration, the heat sink is cooled by the air supplied by the second fan, and the fixed heat generating part is cooled by the heat sink through the second wall. Thus, the adverse influence on other parts by the heat of the heat generating part can be reduced.

In the robot controller, the second fan may be arranged so as to be opposed to the lid part and the opening portion and supply the air to the lid part and the inside of the cover. According to this configuration, the lid part and the air around the lid part are cooled by the air supplied by the second fan. Therefore, the first fan arranged in the vicinity of the lid part can supply the cooled air to the heat generating part to efficiently cool the heat generating part. Further, since a cooling fan dedicated for the lid part is not included, an increase in size of the robot controller can be suppressed.

The robot controller may further include an attaching portion by which the second fan is detachably attached to the housing. The lid part may be attached to the attaching portion. According to this configuration, the lid part attached to the attaching portion is attached to the housing at the same time when the second fan is attached to the housing. Therefore, the lid part can cover the vent hole.

In the robot controller, the housing may have a rectangular solid shape and include: a main body including the first wall, the second wall, and a third wall opposed to the first wall; and a fourth wall opposed to the second wall and detachably provided at the main body. According to this configuration, by detaching the fourth wall, the main body is open, and the maintenance of the electronic parts in the main body can be performed. Further, in a state where the first wall and the fourth wall are exposed to an outside, the robot controller can be horizontally placed with the second wall facing downward, or the robot controller can be vertically placed with a wall other than the first to fourth walls facing downward.

In the robot controller, an electric power supply connector by which electric power is supplied to the second fan may be provided on an outer surface of the first wall. According to this configuration, the second fan arranged outside the first wall can be easily connected to the electric power supply connector.

Advantageous Effects of Invention

The present invention is configured as above and has an effect to being able to provide a robot controller capable of reducing adverse influence caused by dust and the like while reducing an increase in size.

The above object, other objects, features, and advantages of the present invention will be made clear by the following detailed explanation of preferred embodiments with reference to the attached drawings.

DESCRIPTION OF EMBODIMENTS

Hereinafter, an embodiment of the present invention will be specifically described with reference to the drawings. In the following description and the drawings, the same reference signs are used for the same or corresponding components, and a repetition of the same explanation is avoided. In the drawings, upper, lower, left, right, front, and rear directions are defined. However, the directions of a robot controller are not limited to these.

Figure 1:
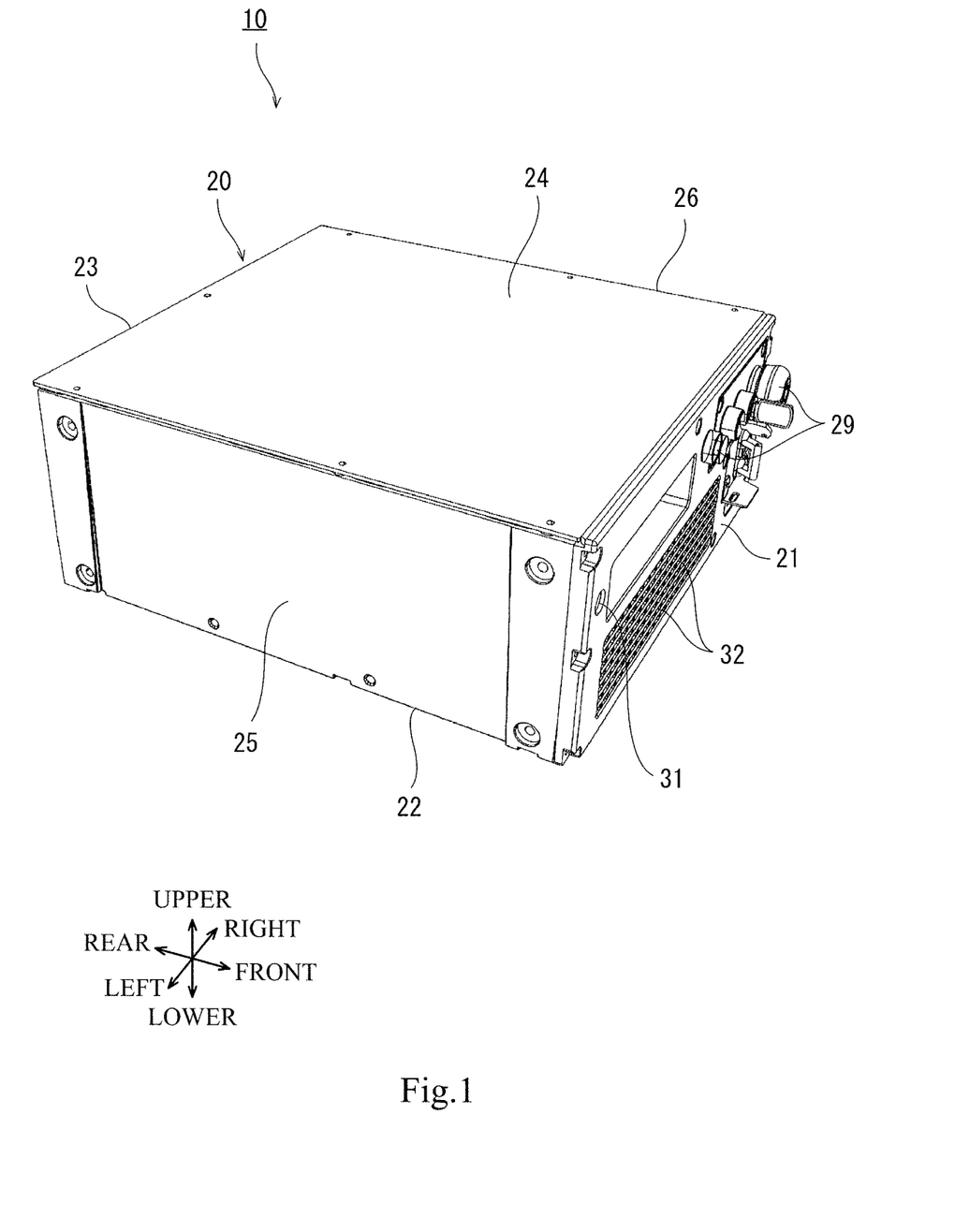
FIG. 1 is a perspective view showing a robot controller according to an embodiment of the present invention.

The configuration of a robot controller 10 according to the embodiment will be described with reference to FIGS. 1 to 3. The robot controller 10 is an apparatus configured to control a motor of a robot (not shown). As shown in FIG. 1, the robot controller 10 includes a housing 20 accommodating electronic parts.

The housing 20 is made of, for example, a material having higher heat conductivity than iron. Examples of such material include metals, such as aluminum. The housing 20 is formed by, for example, die casting by which the housing 20 is formed by pressing molten metal into a mold.

The housing 20 is a casing including an internal space and has, for example, a rectangular solid shape. The housing 20 includes a first wall 21 (front side wall), a second wall 22 (lower side wall), a third wall 23 (rear side wall), a fourth wall 24 (upper side wall), a fifth wall 25 (left side wall), and a sixth wall 26 (right side wall). Each of these walls has a rectangular flat plate shape.

The first wall 21, the second wall 22, the third wall 23, the fifth wall 25, and the sixth wall 26 constitute a main body, and the fourth wall 24 is detachably provided at the main body. For example, through holes (not shown) are provided at the fourth wall 24, and insertion holes (not shown) at which spiral grooves are formed are provided on upper surfaces of the third wall 23, the fifth wall 25, and the sixth wall 26. The fourth wall 24 is attached to the main body by inserting and fastening screws through the through holes to the insertion holes. In contrast, by removing the screws from the insertion holes, the fourth wall 24 can be detached from the main body, and for example, the maintenance of the electronic parts in the main body can be performed.

An operating portion 29 and an electric power supply connector 31 are provided on an outer surface of the first wall 21. The operating portion 29 is operated by a user, and the electric power supply connector 31 is used to supply electric power to below-described second fans. Further, a plurality of first vent holes 32 penetrating the first wall 21 are provided on the outer surface of the first wall 21.

Figure 2:
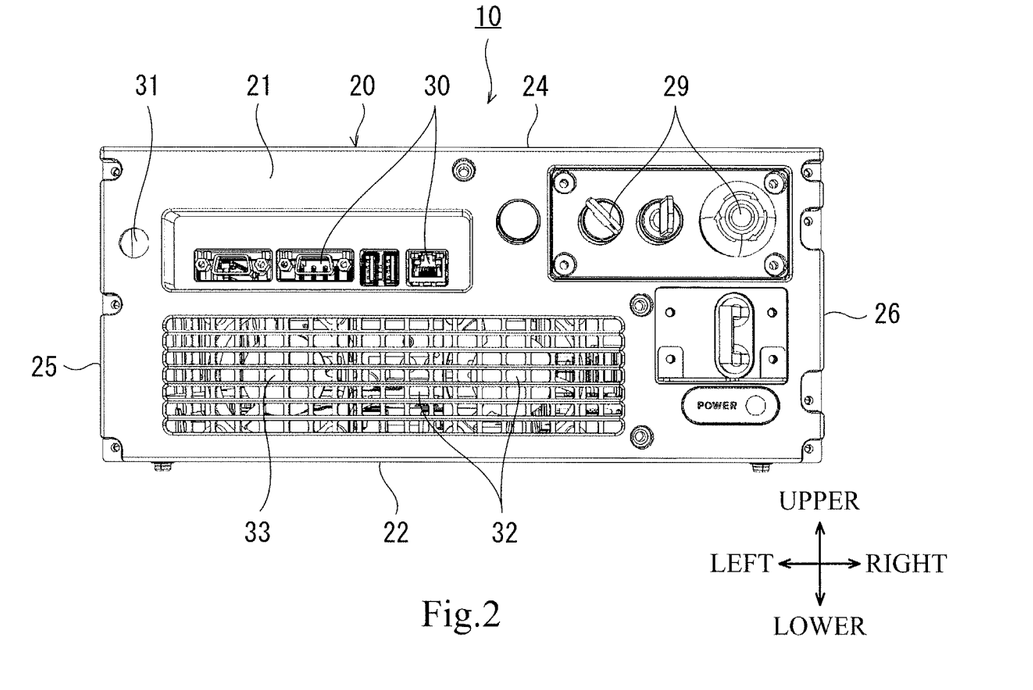
FIG. 2 is a diagram showing the robot controller of FIG. 1 when viewed from a first wall.

As shown in FIG. 2, a plurality of (in the present embodiment, two) first fans 33 are provided in the housing 20 and arranged so as to be spaced apart from each other in a left-right direction. The first fans 33 are provided in the vicinity of the first vent holes 32 so as to be opposed to the first vent holes 32. In a plan view from a front side to a rear side, the first fans 33 are arranged at positions overlapping the first vent holes 32. The first fans 33 are opposed to and arranged parallel to the first wall 21 so as to supply air from the front side to the rear side. With this, the first fans 33 introduce air through the first vent holes 32 at the front side and supply the air to the rear side.

Connection portions 30, such as a connector for external connection, for connection with external instruments (not shown) are provided on the outer surface of the first wall 21. The connection portions 30 are provided at a bottom portion of a depression and arranged higher than the first vent holes 32.

Figure 3:
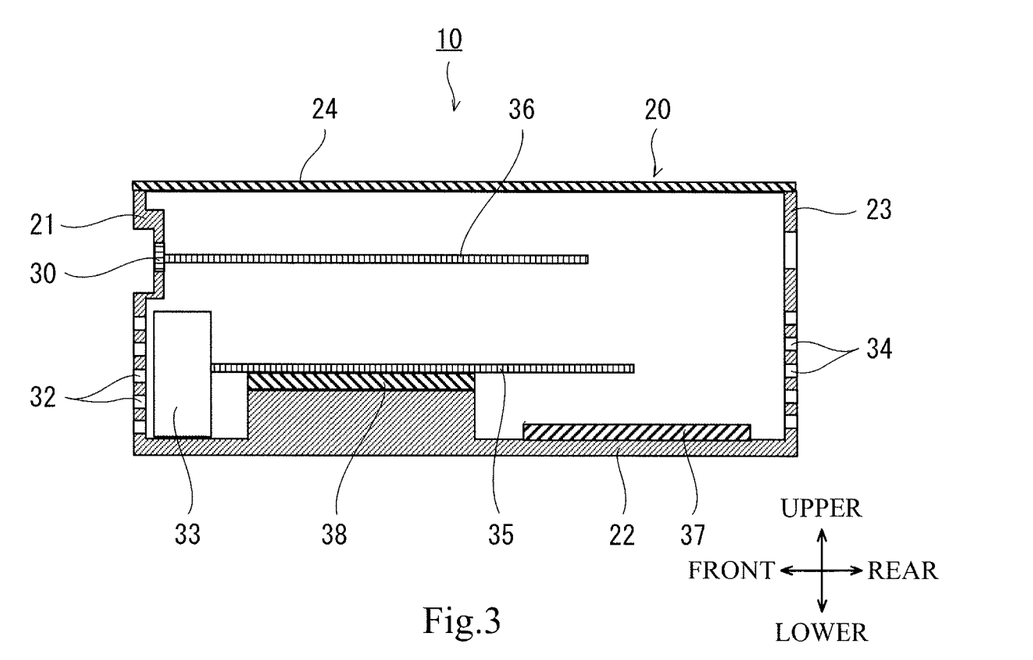
FIG. 3 is a sectional view of the robot controller of FIG. 1.

As shown in FIG. 3, a plurality of third vent holes 34 are open on the third wall 23 opposed to the first wall 21 of the housing 20. In the plan view from the front side to the rear side, the third vent holes 34 are arranged at positions overlapping the first vent holes 32 of the first wall 21. The first fans 33 are arranged between the third vent holes 34 and the first vent holes 32. With this, a first flow passage through which the air introduced by the first fans 33 through the first vent holes 32 flows to the rear side and is then discharged through the third vent holes 34 is provided in the housing 20.

A plurality of electronic parts are accommodated in the housing 20. Examples of the electronic parts include a power circuit substrate 35, a control circuit substrate 36, and a regenerative resistor 37. The power circuit substrate 35, the control circuit substrate 36, and the regenerative resistor 37 are spaced apart from one another and arranged parallel to the second wall 22.

The power circuit substrate 35 includes a power semiconductor element 38 configured to control and supply electric power used to drive the motor of the robot. The control circuit substrate 36 includes a control circuit configured to control the power semiconductor element 38. The regenerative resistor 37 absorbs energy generated from the motor of the robot.

Among these, the power semiconductor element 38 and the regenerative resistor 37 are heat generating parts each having a larger heat generating amount than the other electronic parts, such as the control circuit substrate 36. Each of the power semiconductor element 38 and the regenerative resistor 37 is fixed to the second wall 22 in parallel such that a surface thereof having the largest area contacts an inner surface of the second wall 22. With this, the heat generated from the power semiconductor element 38 and the regenerative resistor 37 are transmitted to the housing 20. Thus, the power semiconductor element 38 and the regenerative resistor 37 radiate heat and are cooled. It should be noted that each of the power semiconductor element 38 and the regenerative resistor 37 may be directly connected to the housing 20 or may be connected to the housing 20 through an interposed member made of a material having high heat conductivity.

The power semiconductor element 38 and the regenerative resistor 37 are arranged at the first flow passage formed by the first fans 33 located between the first vent holes 32 of the first wall 21 and the third vent holes 34 of the third wall 23. With this, the power semiconductor element 38 and the regenerative resistor 37 are cooled by the air supplied by the first fans 33.

The control circuit substrate 36 is arranged above the first fans 33 and located higher than the first flow passage formed by the first fans 33. However, the control circuit substrate 36 may be arranged at the first flow passage formed by the first fans 33. The control circuit substrate 36 is perpendicularly fixed to the first wall 21 such that a surface thereof (in the present embodiment, a surface having the smallest area) other than a surface having the largest area contacts an inner surface of the first wall 21. However, the control circuit substrate 36 may be fixed such that the surface thereof having the largest area contacts any of the walls of the housing 20.

The third wall 23 is provided with through holes through which, for example, a cable of an external power supply for the robot controller 10 passes.

Figure 4:
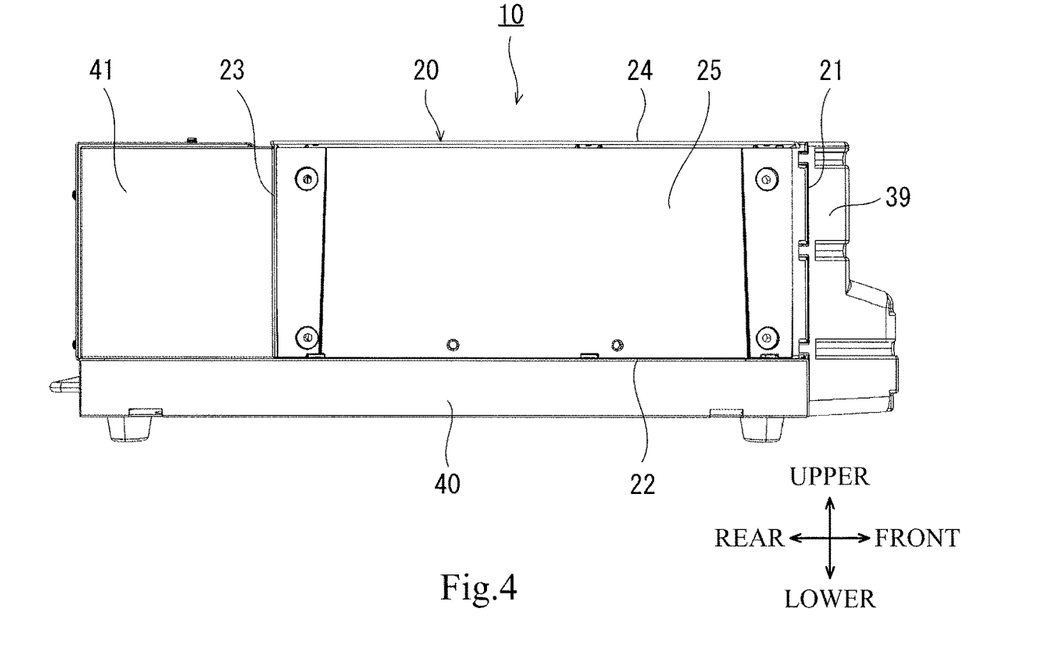
FIG. 4 is a diagram showing the robot controller configured by attaching a first cover, a second cover, and a third cover to a housing of FIG. 1, when viewed from a fifth wall.
Figure 5:
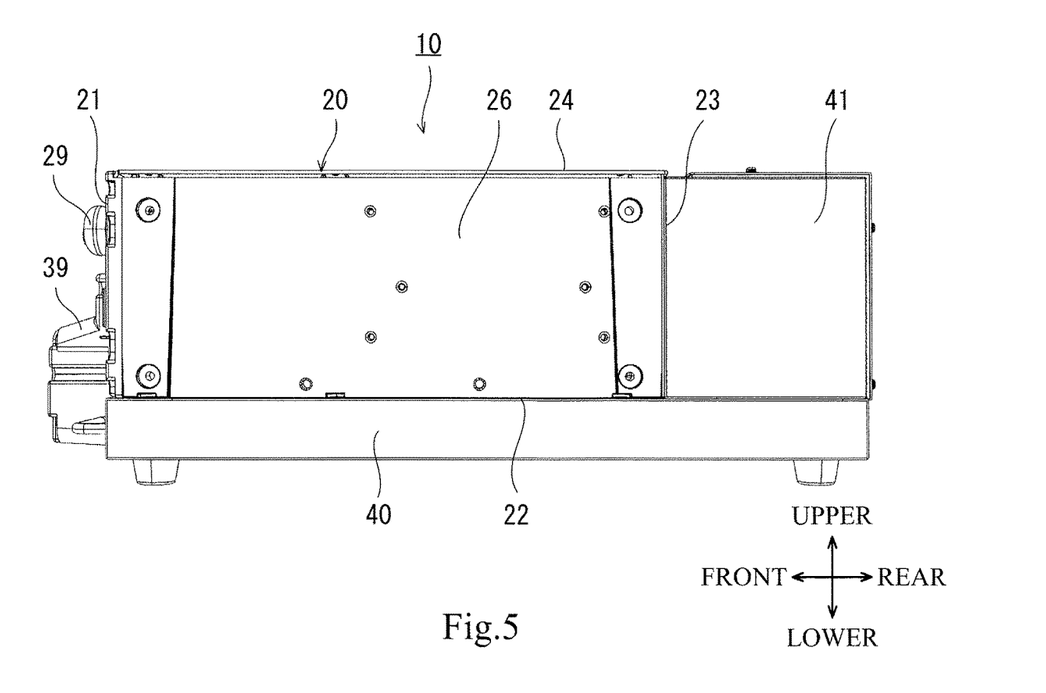
FIG. 5 is a diagram showing the robot controller of FIG. 4 when viewed from a sixth wall.

Next, the robot controller 10 including the housing 20 that is sealed will be described with reference to FIGS. 4 to 8. As shown in FIGS. 4 and 5, a first cover 39 is attached to the outer surface of the first wall 21 of the housing 20, and a second cover 40 is attached to an outer surface of the second wall 22. Further, a third cover 41 is attached to an outer surface of the third wall 23. The first cover 39, the second cover 40, and the third cover 41 are detachable from the housing 20, and for example, are attached to the first wall 21, the second wall 22, and the third wall 23 by screws, respectively.

The first cover 39, the second cover 40, and the third cover 41 are made of, for example, a material having higher heat conductivity than iron, and one example of such material is aluminum. The housing 20 is formed by, for example, die casting by which the housing 20 is formed by pressing molten metal into a mold.

The second cover 40 has a rectangular solid shape whose upper side is open. The second cover 40 is provided at a lower side of the housing 20 and the third cover 41 and covers a lower surface of the second wall 22 of the housing 20 and a lower surface of the third cover 41. Thus, the second cover 40 forms a closed space together with the housing 20 and the third cover 41. A length of the second cover 40 in a front-rear direction is equal to a sum of a length of the housing 20 in the front-rear direction and a length of the third cover 41 in the front-rear direction. The second cover 40 extends over the entire second wall 22 and the entire third cover 41 in the front-rear direction.

The third cover 41 has a rectangular solid shape whose front side is open. The third cover 41 is provided at a rear side of the housing 20 and covers a rear surface of the third wall 23 of the housing 20. The third cover 41 forms a closed space together with the third wall 23 of the housing 20. A height of the third cover 41 in an upper-lower direction is equal to a height of the housing 20 in the upper-lower direction. The third cover 41 extends over the entire outer surface of the third wall 23 of the housing 20 in the upper-lower direction. A shape formed by covering the housing 20 with the second cover 40 and the third cover 41 is a rectangular solid shape.

Figure 6:
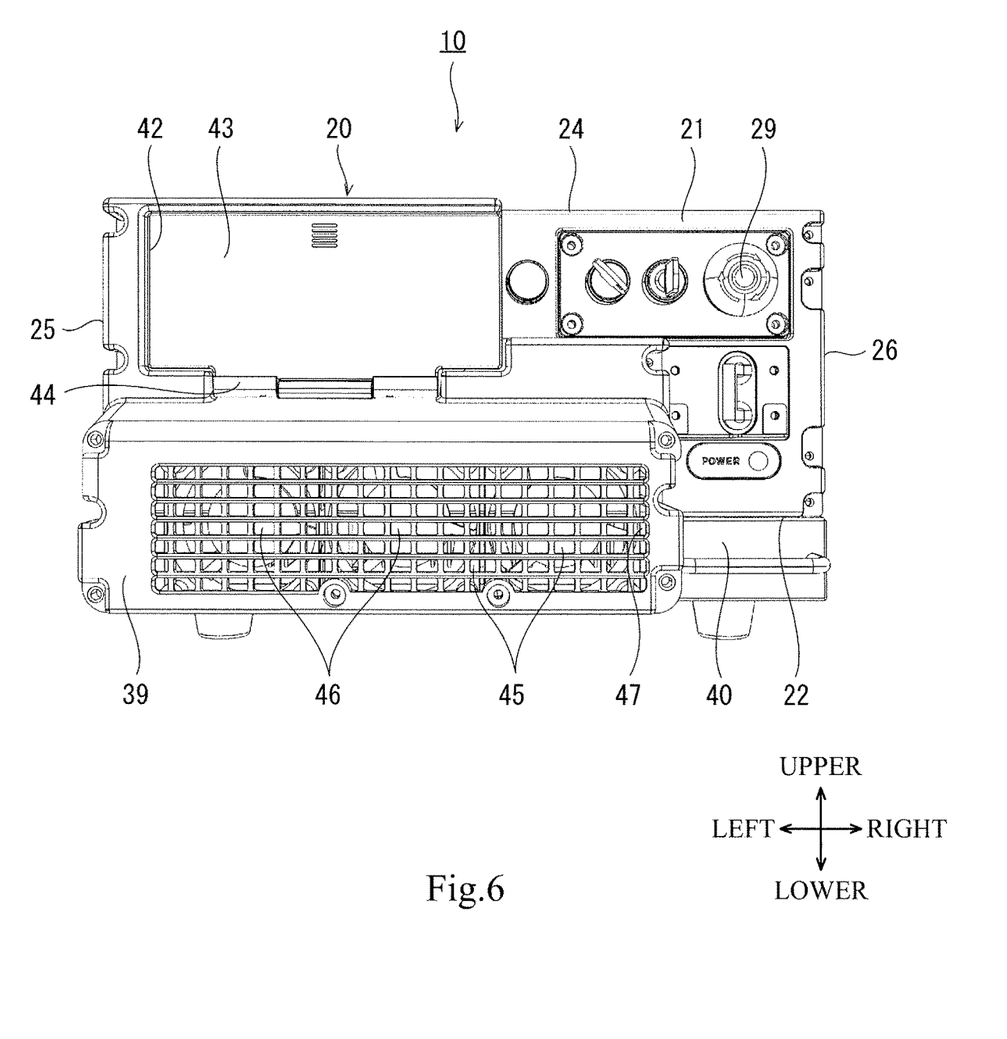
FIG. 6 is a diagram showing the robot controller of FIG. 4 when viewed from the first wall.

As shown in FIG. 6, the first cover 39 covers the first vent holes 32 and the connection portions 30 on the first wall 21. The first cover 39 is provided with a first opening portion 42 and an open/close portion 43. The first opening portion 42 is open at a position opposed to the connection portions 30. The open/close portion 43 can open and close the first opening portion 42.

In the plan view from the front side to the rear side, the first opening portion 42 is arranged at a position overlapping the connection portions 30. For example, the open/close portion 43 is attached to the first cover 39 by a hinge 44. With this, the open/close portion 43 can rotate in the upper-lower direction by the hinge 44 as a fulcrum to open and close the first opening portion 42. The open/close portion 43 is arranged so as to be opposed to the connection portions 30 and spaced apart from the first wall 21. A projecting portion 43a is provided on an inner surface of the open/close portion 43. The projecting portion 43a has a tubular shape and projects from the inner surface of the open/close portion 43 toward the first wall 21 so as to surround the connection portions 30. A sealing portion 43b, such as a sponge, is provided at a tip end of the projecting portion 43a.

As above, when the first opening portion 42 is opened by opening the open/close portion 43, the connection portions 30 are exposed to an outside through the first opening portion 42. Therefore, an operator can easily connect, for example, cords to the connection portions 30. On the other hand, when the first opening portion 42 is closed by closing the open/close portion 43, the connection portions 30 are covered with the projecting portion 43a and the sealing portion 43b. Therefore, the adhesion of the dust and the like contained in outside air to the connection portions 30 is reduced, and the invasion of the dust and the like into the housing 20 through gaps of the connection portions 30 is reduced.

A plurality of second vent holes 45 are provided at the first cover 39. The second vent holes 45 are arranged lower than the first opening portion 42. A plurality of (in the present embodiment, three) second fans 46 are provided inside the first cover 39 so as to be opposed to the second vent holes 45. With this, the first cover 39 detachable from the housing 20 serves as an attaching portion by which the second fans 46 are detachably attached to the housing 20.

The second fans 46 are covered with the first cover 39. In the plan view from the front side to the rear side, the second fans 46 are arranged at positions overlapping the second vent holes 45 of the first cover 39. Further, the second fans 46 are arranged inside the first cover 39 so as to be lined up in the left-right direction. The second fans 46 are arranged on the outer surface of the first wall 21 and are electrically connected to the electric power supply connector 31 (FIG. 2) provided on the outer surface of the first wall 21. Electric power is supplied through the electric power supply connector 31 to the second fans 46. The second fans 46 are opposed to and arranged parallel to an inner surface of the first cover 39 so as to supply air from the front side to the rear side. With this, the second fans 46 introduce the outside air through the second vent holes 45 at the front side and supply the air to the rear side.

It should be noted that the operating portion 29 having a sealed configuration does not have to be covered with the first cover 39. With this, since the operating portion 29 is exposed to the outside, an operator can easily operate the operating portion 29.

A width of the first cover 39 in the left-right direction is smaller than a width of the second cover 40 in the left-right direction. Therefore, the first cover 39 does not cover a part of the second cover 40 which part is located under the operating portion 29 in the left-right direction, and therefore, a front surface portion of the second cover 40 is exposed at a position under the operating portion 29.

A second opening portion 47 is provided at the front surface portion of the second cover 40 so as to be located in a range where the second fans 46 are arranged in the left-right direction. Therefore, the air introduced by the second fans 46 through the second vent holes 45 flows through the second opening portion 47 to be supplied to an inside of the second cover 40.

Figure 7:
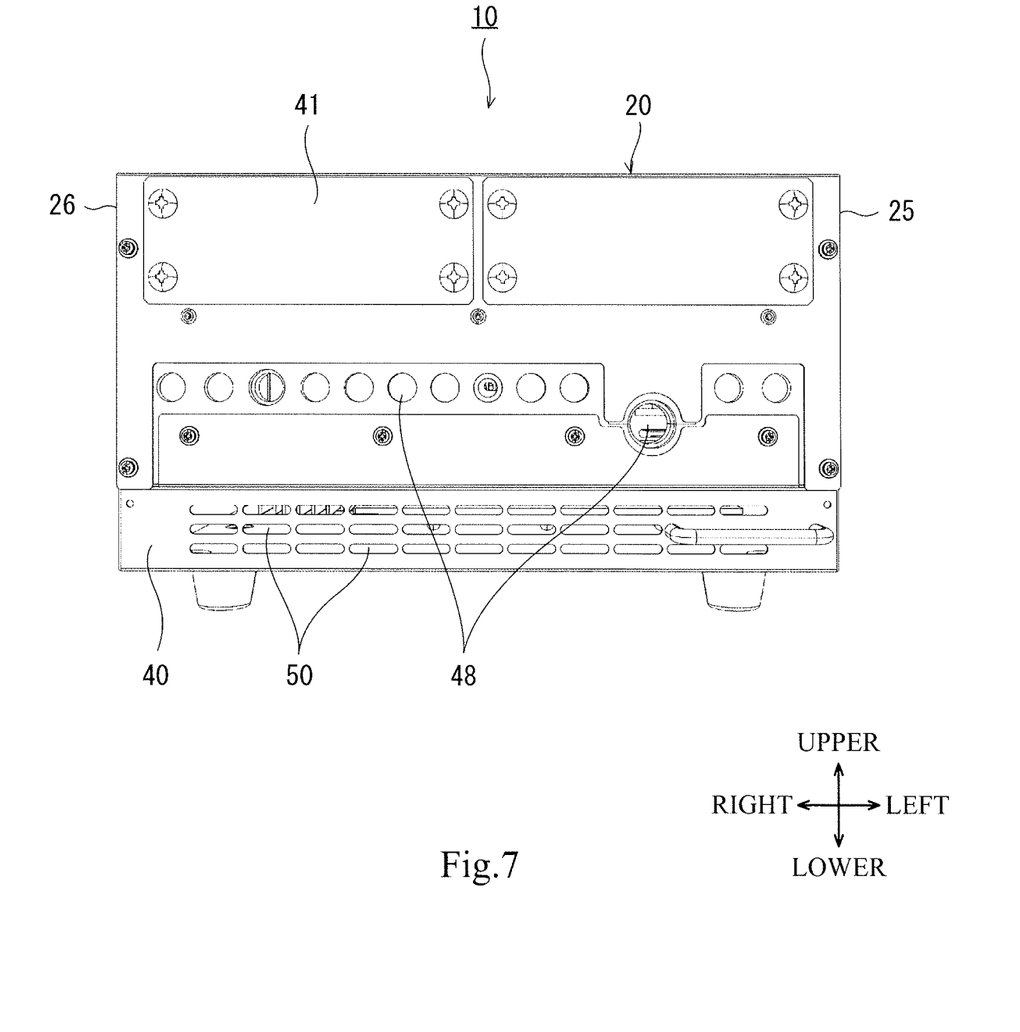
FIG. 7 is a diagram showing the robot controller of FIG. 4 when viewed from a third wall.

As shown in FIG. 7, a plurality of through holes 48 are provided at the third cover 41. A cable (not shown) connected to an external power supply, such as a commercial power supply, and used to supply electric power, a cord (not shown) connecting each electric part, such as a substrate, to an external instrument, and the like pass through the through holes 48.

A width of the second cover 40 in the left-right direction is equal to a width of the third cover 41 in the left-right direction. The second cover 40 covers the entire third wall 23 in the left-right direction. A plurality of fourth vent holes 50 are provided at the second cover 40. The fourth vent holes 50 are arranged at an entire rear surface portion of the second cover 40.

Figure 8A:
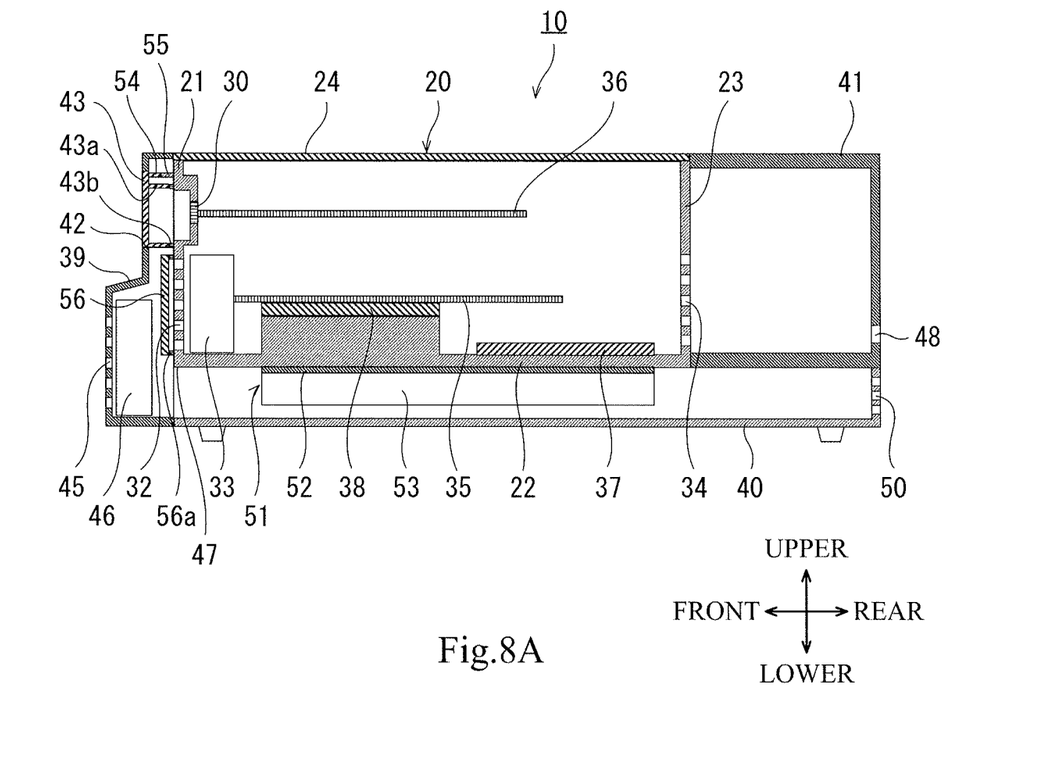
FIG. 8A is a sectional view of the robot controller of FIG. 4.

As shown in FIG. 8A, an internal space of the first cover 39 and an internal space of the second cover 40 communicate with each other through the second opening portion 47 of the front surface portion of the second cover 40. The second vent holes 45 make the outside and the internal space of the first cover 39 communicate with each other, and the fourth vent holes 50 make the outside and the internal space of the second cover 40 communicate with each other. The second fans 46 are provided inside the first cover 39 so as to be located between the second vent holes 45 and the second opening portion 47. The second fans 46 are opposed to the second vent holes 45 and the second opening portion 47. Therefore, the air introduced by the second fans 46 from the outside through the second vent holes 45 flows through the first cover 39 and the second opening portion 47 into the second cover 40 and is discharged to the outside through the fourth vent holes 50. As above, a second flow passage formed by the second fans 46 is provided in the first cover 39 and the second cover 40.

Figure 8B:
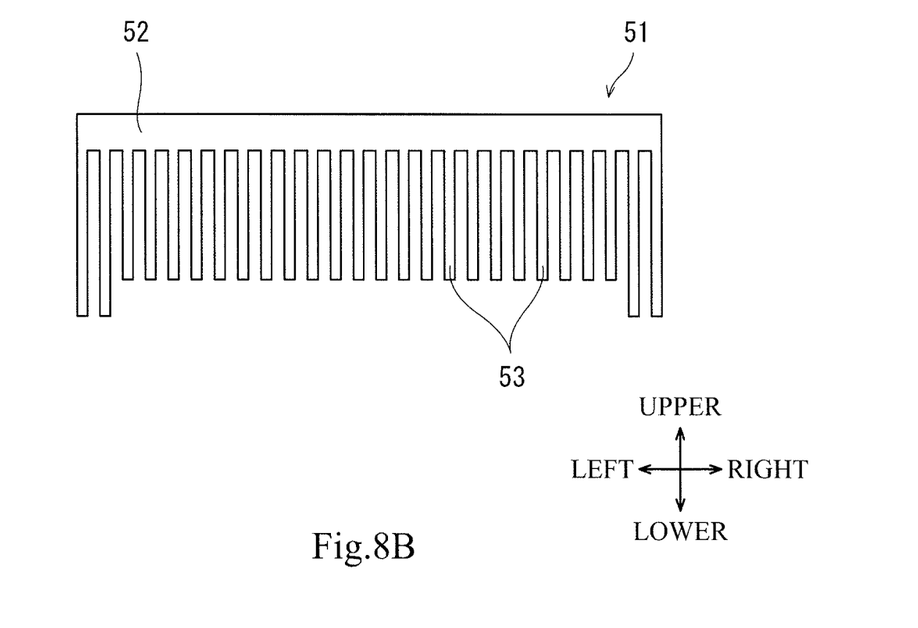
FIG. 8B is a diagram showing a heat sink.

A heat sink 51 is attached to the outer surface (lower surface of the housing 20) of the second wall 22 of the housing 20. The heat sink 51 is covered with the second cover 40. The heat sink 51 is detachably attached to the housing 20 by screws or the like.

The heat sink 51 is a heat radiating member for the heat generating parts and is made of, for example, a metal material, such as aluminum or copper, having excellent heat conductivity. The heat sink 51 includes: a base portion 52 joined to the housing 20; and a plurality of fins 53. The base portion 52 has a rectangular flat plate shape and extends in the front-rear direction. Each of the fins 53 has a rectangular flat plate shape and extends in the upper-lower direction perpendicular to the base portion 52. The fins 53 are arranged at regular intervals. The heat sink 51 is provided inside the second cover 40 so as to be located at the second flow passage formed by the second fans 46 arranged between the second vent holes 45 and the fourth vent holes 50. The heat sink 51 is cooled by the air supplied by the second fans 46.

In the second flow passage, the second fans 46 are arranged upstream of the heat sink 51. Therefore, the second fans 46 can supply air to the heat sink 51, and the air can smoothly flow between the fins 53 of the heat sink 51. Since the fins 53 extend in the front-rear direction along a direction in which the air in the second flow passage flows, the air smoothly flows from the second vent holes 45 to the fourth vent holes 50. Thus, the heat radiation property of the heat sink 51 improves.

The heat generating parts (the power semiconductor element 38 and the regenerative resistor 37) are connected to the heat sink 51 through the second wall 22. To be specific, the heat generating parts are fixed to the inner surface of the second wall 22, and the heat sink 51 is fixed to the outer surface of the second wall 22. The heat generating parts and the heat sink 51 sandwich the second wall 22 and are arranged at positions overlapping each other in the upper-lower direction. The second wall 22 is made of a material having excellent heat conductivity. Therefore, the heat generating parts are efficiently cooled through the second wall 22 by the heat sink 51 which has radiated heat.

A lid part 56 is attached to the outer surface of the first wall 21 so as to close the first vent holes 32 of the first wall 21. The lid part 56 has, for example, a flat plate shape and is attached to the first cover 39. Therefore, the lid part 56 can be attached to the housing 20 at the same time when the first cover 39 is attached to the housing 20.

A sealing portion 56a is attached to an inner surface of the lid part 56 along an outer periphery of the lid part 56. The lid part 56 is attached to the first wall 21 such that the sealing portion 56a surrounds the first vent holes 32. With this, the first vent holes 32 are closed by the lid part 56, and thus, the housing 20 is sealed. Therefore, the dust and the like contained in the outside air are prevented from invading into the housing 20, and adverse influence, such as malfunctions of the electronic parts in the housing 20, caused by the dust and the like can be reduced.

The lid part 56 is arranged at an upper side of the second opening portion 47. A height of each second fan 46 in the upper-lower direction is larger than a height of the second opening portion 47 in the upper-lower direction. The second fans 46 overlap the second opening portion 47 and the lid part 56 arranged above the second opening portion 47. The second fans 46 are arranged between the second vent holes 45 and a group of the lid part 56 and the second opening portion 47. With this, the second fans 46 are arranged so as to be opposed to the second vent holes 45, the second opening portion 47, and the lid part 56. Therefore, the air introduced by the second fans 46 through the second vent holes 45 is supplied to the lid part 56 and the second opening portion 47. On this account, the heat sink 51 located at the second flow passage is cooled through the second opening portion 47.

The lid part 56 is made of, for example, a material having higher heat conductivity than iron, and one example of such material is aluminum. Therefore, the lid part 56 and the air around the lid part 56 are cooled by the air supplied by the second fans 46. Since the lid part 56 is located upstream of the first fans 33, the first fans 33 can supply the air, which has been cooled by the lid part 56, to the heat generating parts to efficiently cool the heat generating parts.

A locked portion 54 is provided on the inner surface of the open/close portion 43, and a locking portion 55 is provided on the outer surface of the first wall 21. When the open/close portion 43 closes the first opening portion 42, the locked portion 54 is locked to the locking portion 55. With this, the open/close portion 43 is detachably attached.

According to the robot controller 10 configured as above, the first vent holes 32 are open on the wall of the housing 20, and the air introduced through the first vent holes 32 is supplied to the heat generating parts by the first fans 33. Since the heat generating parts are cooled by the air introduced from the outside, adverse influence on the other electronic parts and the like by the heat of the heat generating parts can be reduced.

The robot controller 10 includes the lid part 56 capable of covering the first vent holes 32. Since the first vent holes 32 are sealed by the lid part 56, the dust and the like are prevented from being introduced from the outside through the first vent holes 32 into the housing 20. Therefore, adverse influence on the electronic parts in the housing 20 by the dust and the like can be reduced.

The heat generating parts are fixed to an inner surface of the housing 20, and the housing 20 is made of a material having higher heat conductivity than iron. With this, even when the lid part 56 covers the first vent holes 32, the heat of the heat generating parts is radiated to the outside of the housing 20 by a part of the housing 20 which part is exposed to the outside. Thus, adverse influence on the other electronic parts and the like by the heat of the heat generating parts can be reduced.

The first vent holes 32 are covered with the lid part 56, but the other surfaces (for example, the fourth wall 24, the fifth wall 25, and the sixth wall 26) are not covered. With this, even when the housing 20 is sealed by the lid part 56, the increase in size of the robot controller 10 can be reduced.

The lid part 56 is detachable from the housing 20. Therefore, depending on, for example, the states of the dust and the like in the outside air, the lid part 56 can be attached to the housing 20 to cover the first vent holes 32, or the lid part 56 can be detached from the housing 20 to open the first vent holes 32.

Further, the heat sink 51 is detachably attached to the outer surface of the second wall 22 to which the heat generating parts are fixed. The air introduced through the second vent holes 45 is supplied by the second fans 46 to the heat sink 51. With this, the heat sink 51 is cooled by the air, and the heat generating parts are cooled by the heat sink 51 through the second wall 22. Therefore, the adverse influence on the electronic parts and the like by the heat of the heat generating parts can be reduced.

The second fans 46 supplies the air to the lid part 56 and the heat sink 51. With this, the heat generating parts can be cooled by the cooled heat sink 51 through the second wall 22. Further, the air upstream of the first fans 33 is cooled by the cooled lid part 56, and the first fans 33 can supply this cooled air to the heat generating parts to cool the heat generating parts. Since the heat generating parts are cooled as above, adverse influence on the other electronic parts and the like by the heat of the heat generating parts can be reduced.

The housing 20 includes: the main body including the first wall 21, the second wall 22, and the third wall 23; and the fourth wall 24 opposed to the second wall 22 and detachably provided at the main body. The main body is opened by detaching the fourth wall 24 from the main body, and with this, the maintenance of the substrate and the like accommodated in the main body can be performed.

Further, the fourth wall 24 is provided parallel to the second wall 22 and perpendicular to the fifth wall 25 and the sixth wall 26. Therefore, in a state where the first wall 21 and the fourth wall 24 are exposed to the outside, the robot controller 10 can be horizontally placed with the second wall 22 facing downward (in this case, the control circuit substrate 36 extends in a horizontal direction), or the robot controller 10 can be vertically placed with the fifth wall 25 or the sixth wall 26 facing downward (in this case, the control circuit substrate 36 extends in a vertical direction). On this account, even when an arrangement space of the robot controller 10 is limited, the direction of the arrangement of the robot controller 10 can be changed in accordance with the space such that the operating portion 29 and the like on the first wall 21 can be operated, and the maintenance can be performed by detaching the fourth wall 24.

Further, the electric power supply connector 31 by which electric power is supplied to the second fans 46 is provided on the outer surface of the first wall 21 of the housing 20. When the second fans 46 are arranged outside the first wall 21, the second fans 46 can be easily connected to the electric power supply connector 31.

OTHER EMBODIMENTS

The present invention is not limited to the above embodiment explained based on the above description and the drawings. For example, the following embodiments are also included within the technical scope of the present invention.

In the above embodiment, the second cover 40 covers the heat sink 51 attached to the second wall 22 of the housing 20. However, the second cover 40 may be attached to the housing 20 so as to cover the second wall 22 to which the heat sink 51 is not attached. In this case, by supplying the air to the inside of the second cover by the second fans 46, the second wall 22 made of a material having high heat conductivity inside the second cover 40 is cooled. Therefore, the heat generating parts fixed to the second wall 22 are cooled by the second wall 22.

In the above embodiment, the first fans 33 are arranged so as to be opposed to the first vent holes 32. However, the positions of the first fans 33 are not limited to this as long as the first fans 33 can supply the air to the heat generating parts. For example, the first fans 33 are arranged so as to be opposed to the third vent holes 34. Also in this case, the first fans 33 suck the air through the first vent holes 32, supplies the air to the heat generating parts, and discharges the air through the third vent holes 34.

In the above embodiment, the second fans 46 are arranged upstream of the heat sink 51. However, the second fans 46 may be arranged downstream of the heat sink 51. With this, the air sucked by the second fans 46 through the second vent holes 45 is supplied to the heat sink 51.

In the above embodiment, the housing 20 is made of a material having higher heat conductivity than iron. However, not all the walls of the housing 20 have to be made of the material having higher heat conductivity than iron. For example, when at least the second wall 22 of the housing 20 is made of the material having higher heat conductivity than iron, the other walls (for example, the first wall 21 and the fourth wall 24) may be made of resin. With this, the material cost of the housing 20 can be reduced.

In the above embodiment, the lid part 56 is detachably attached to the housing 20 by screws or the like. However, the lid part 56 does not have to be detachable from the housing 20 as long as the lid part 56 can cover the first vent holes 32. For example, the lid part 56 may be attached to the housing 20 by a hinge or the like, and the first vent holes 32 may be covered by opening and closing the lid part 56.

The above embodiments may be combined with each other as long as they do not exclude each other. From the foregoing explanation, many modifications and other embodiments of the present invention are obvious to one skilled in the art. Therefore, the foregoing explanation should be interpreted only as an example and is provided for the purpose of teaching the best mode for carrying out the present invention to one skilled in the art. The structures and/or functional details may be substantially modified within the scope of the present invention.

INDUSTRIAL APPLICABILITY

The robot controller of the present invention is useful as, for example, a robot controller capable of reducing adverse influence caused by dust and the like while suppressing an increase in size.

REFERENCE SIGNS LIST 10 robot controller
20 housing
21 first wall (wall)
32 first vent hole (vent hole)
33 first fan (fan)
56 lid part
22 second wall
23 third wall
24 fourth wall
39 first cover (attaching portion)
40 second cover (cover)
51 heat sink
45 second vent hole
46 second fan
47 second opening portion (opening portion)
31 electric power supply connector

The invention claimed is:

1. A robot controller configured to control a motor of a robot,
the robot controller comprising:
a housing accommodating a heat generating part that generates heat;
a vent hole that is open on a wall of the housing;
a fan configured to supply air, introduced through the vent hole into the housing, to the heat generating part; and
a lid part configured to cover the vent hole, wherein:
the wall is a first wall;
the fan is a first fan; and
a second wall of the housing is made of a material having high heat conductivity, the heat generating part being fixed to the second wall,
the robot controller further comprising:
a cover covering the second wall and including an opening portion; and
a second fan arranged so as to be opposed to the opening portion and configured to supply the air to an inside of the cover through the opening portion.

2. The robot controller according to claim 1, further comprising a heat sink detachably attached to an outer surface of the second wall, wherein:
the cover covers the heat sink; and
the second fan supplies the air to the heat sink.

3. The robot controller according to claim 1, wherein the second fan is arranged so as to be opposed to the lid part and the opening portion and supplies the air to the lid part and the inside of the cover.

4. The robot controller according to claim 1, further comprising an attaching portion by which the second fan is detachably attached to the housing, wherein
the lid part is attached to the attaching portion.

5. The robot controller according to claim 1, wherein the housing has a rectangular solid shape and includes:
a main body including the first wall, the second wall, and a third wall opposed to the first wall; and
a fourth wall opposed to the second wall and detachably provided at the main body.

6. The robot controller according to claim 1, wherein an electric power supply connector by which electric power is supplied to the second fan is provided on an outer surface of the first wall.

* * * * *